US006633623B2

(12) United States Patent
Dulka et al.

(10) Patent No.: US 6,633,623 B2
(45) Date of Patent: *Oct. 14, 2003

(54) APPARATUS AND METHODS FOR PROTECTING A JET PUMP NOZZLE ASSEMBLY AND INLET-MIXER

(75) Inventors: Catherine P. Dulka, West Chester, PA (US); John F. Ackerman, Laramie, WY (US); David W. Sandusky, Los Gatos, CA (US); Mark O. Lenz, San Jose, CA (US); Leland L. Lantz, Wayne, SC (US); Michael B. McMahan, Glenmore, PA (US); Glen Arthur MacMillan, Simpsonville, SC (US)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 46 days.

(21) Appl. No.: 09/723,276

(22) Filed: Nov. 29, 2000

(65) Prior Publication Data

US 2002/0101952 A1 Aug. 1, 2002

(51) Int. Cl.[7] ................................................ G21C 9/00
(52) U.S. Cl. .................. 376/306; 376/305; 376/372; 417/195; 417/157; 239/591; 239/589; 239/600; 428/312
(58) Field of Search ................ 376/306, 305, 376/372; 417/195, 157; 239/591, 589, 600; 428/312

(56) References Cited

U.S. PATENT DOCUMENTS

| | | | | |
|---|---|---|---|---|
| 3,410,091 A | * | 11/1968 | Frutschi | 60/59 |
| 4,280,662 A | * | 7/1981 | Erickson et al. | 239/591 |
| 4,297,150 A | * | 10/1981 | Foster et al. | 148/6.3 |
| 4,564,555 A | * | 1/1986 | Hornberger | 428/312.8 |
| 4,828,790 A | * | 5/1989 | Honda | 376/306 |
| 4,847,043 A | * | 7/1989 | Gluntz | 376/372 |
| 5,137,683 A | * | 8/1992 | Hertz et al. | 376/409 |
| 5,147,597 A | * | 9/1992 | Roofthooft et al. | 148/266 |
| 5,280,250 A | | 1/1994 | Jayaweera et al. | 324/452 |
| 5,367,546 A | * | 11/1994 | Lau et al. | 376/245 |
| 5,444,747 A | | 8/1995 | Terhune | |
| 5,527,471 A | * | 6/1996 | Hong et al. | 210/761 |
| 6,254,341 B1 | * | 7/2001 | Ackerman et al. | 415/200 |
| 6,277,213 B1 | * | 8/2001 | Schenker | 148/243 |

FOREIGN PATENT DOCUMENTS

| DE | 0044103050 A1 | * | 8/1992 |
|---|---|---|---|
| JP | 59-126996 | * | 7/1984 |

OTHER PUBLICATIONS

"Determination of Zeta Potential and pH of Zero Charge of Oxides at High Temperatures," Jayaweera et al., pp. 524–528, Rev. Sci. Instrum. 64(2), Feb. 1993.

"Corrosion 93," Jayaweera et al., The NACE Annual Conference and Corrosion Show, Paper No. 608, pp. 608/02–608/10.

"Determination of the High Temperature Zeta Potential and pH of Zero Charge of Some Transition Metal Oxides," Jayaweera et al., pp. 19–27, Colloids and Surfaces A: Physicochemical and Engineering Aspects, 85 (1994).

* cited by examiner

Primary Examiner—Charles T. Jordan
Assistant Examiner—Rick Palabrica
(74) Attorney, Agent, or Firm—Nixon & Vanderhye

(57) ABSTRACT

A jet pump for a nuclear reactor includes a riser and an inlet mixer having a set of nozzles and a mixing section for receiving coolant flow from the nozzles and suction flow from an annular space between the reactor vessel and the shroud core. To minimize or eliminate electrostatic deposition of charged particulates carried by the coolant on interior wall surface of the inlet-mixer of the jet pump, and also to inhibit stress corrosion cracking, the interior wall surfaces of the nozzles and mixing section are coated with a ceramic oxide such as $TiO_2$ and $Ta_2O_5$ to thicknesses of about 0.5–1.5 microns.

11 Claims, 2 Drawing Sheets

APPARATUS AND METHODS FOR PROTECTING A JET PUMP NOZZLE ASSEMBLY AND INLET-MIXER

BACKGROUND OF THE INVENTION

The present invention relates to apparatus and methods for eliminating or substantially inhibiting electrostatic deposition of charged particles from the coolant onto the surface of an inlet-mixer of a jet pump forming part of a water recirculation system in a boiling water nuclear reactor, and for inhibiting stress corrosion cracking of the metallic parts. This invention particularly relates to an insulating barrier coating that eliminates or substantially inhibits the interaction between the conductive metal housing of the inlet-mixer of the jet pump assembly and the ionic particles in the fluid.

In a boiling water nuclear reactor, an annular space is defined between the core shroud and the reactor pressure vessel wall. Jet pumps are located in the annular space for recirculating coolant through the reactor. The recirculation system circulates the cooling medium around the nuclear reactor core. Jet pumps, which contain no moving parts, provide an internal circulation path for the core coolant flow. Typically, a substantial number of jet pumps, for example, on the order of sixteen to twenty-four, are installed in this annular space. Each jet pump assembly consists of a riser assembly, a riser brace, two inlet-mixer assemblies, and two diffuser assemblies. The inlet-mixer includes a nozzle and a suction inlet. The nozzle may have one orifice or five orifices, depending on the jet pump design. The top of the inlet-mixer is mechanically clamped to the top of the riser transition piece, while the exit end of the inlet-mixer fits into a slip joint with the top of the diffuser. The inlet-mixer is a removable component.

A recirculation pump, external to the reactor vessel, pulls suction from the downward flow of coolant in the annular space. The coolant is pumped to a higher pressure, and is distributed through a manifold to the jet pumps, where the coolant flows in an upward direction through the risers. The coolant splits in the transition piece and changes direction. It is then accelerated in a downward direction through the nozzles and into a mixer section of the jet pump. The nozzles cause a high velocity coolant flow that is approximately one third of the core flow and discharge into the inlet-mixers. Momentum causes surrounding water in the downcomer region of the annulus to also enter the mixer section where it mixes with the outflow from the nozzles for flow through the mixer section and diffuser. This combined flow discharges into the lower core plenum. The coolant then flows upward between the control rod drive guide tubes and is distributed for flow along individual fuel rods inside the fuel channels.

Over time, contaminants build up on the inside surface of the inlet-mixers including the jet pump nozzles, forming a layer of "crud." There is also potential for stress corrosion cracking along these surfaces. The build-up of "crud" is believed caused by charged particles suspended in the coolant which interact with the metallic inner surface of the inlet-mixer inducing a triboelectrostatic charge on the surface. This charge creates an electrostatic potential that attracts the suspended particles in the fluid to the metallic surface where they form a layer of particle contaminants. The greatest deposition of "crud" is observed in areas that experience a high velocity flow rate.

In the event that the build-up layer becomes excessive, the performance of the recirculation system will be degraded. This degradation will affect the efficiency of the plant because the recirculation pumps must be run at a higher speed to maintain core flow. Degradation of jet pump performance can also result in extreme jet pump vibration and damage to jet pump components. Eventually, the inlet-mixer must be mechanically cleaned or replaced during regular maintenance and refueling outages. This process is expensive and time consuming. Consequently, it is important that the layer of "crud" be eliminated, substantially minimized or its rate of "build up" curtailed" and that a clear flow path is maintained.

In the past, cleaning processes have been proposed that remove the "crud" layer from the inside surface of the inlet-mixer. These processes require removal of the inlet-mixer from the reactor for cleaning in the fuel pool. This is typically accomplished at regular scheduled shutdowns of the reactor, at which times the necessary maintenance is performed. A process using an electrical circuit has also been proposed that minimizes the electrostatic deposition of charged particles on the inlet-mixer surfaces that are exposed to the free stream electrical potential (See U.S. Pat. No. 5,444,747). This process employs a DC circuit with an active element feedback loop that adjusts the surface potential of the inlet-mixer to minimize the net flux to the inner conducting surface of the parts and therefore minimizes particulate deposition. This process, however, requires significant attention and maintenance.

Accordingly, there remains a need for apparatus and methods of protecting the inlet-mixers of the jet pumps from contaminant build-up. Furthermore, there remains a need for a solution to the problem of "crud" build-up which gradually degrades their performance and requires the need for periodically cleaning and maintaining the jet pump.

BRIEF SUMMARY OF THE INVENTION

In accordance with a preferred embodiment of the present invention, there is provided an insulator coating for application to inlet-mixer surfaces to reduce the electrostatic potential between the ionic fluid flow and such surfaces and thereby eliminate or reduce the build-up of crud. Without the electrostatic potential, the particulate layer does not form or is substantially inhibited or reduced in its formation. Furthermore, the insulator coating reduces the susceptibility of the inlet-mixer surfaces to stress corrosion cracking by lowering the electrochemical potential (ECP).

To accomplish the foregoing and in accordance with a preferred embodiment of this invention, the interior surfaces of the inlet-mixer are provided with a coating which reduces or eliminates the build-up of charged particles on those surfaces. Particularly, the interior surfaces of each inlet-mixer are coated with a dielectric material. The non-conductive coating electrically insulates the surfaces of these parts from the flow and therefore interferes with the electrostatic potential caused by the induced triboelectrostatic charge on the metallic inner surfaces of the inlet-mixer and hence the potential for interaction with charged particles suspended in the water. Thus, the coating eliminates or greatly inhibits interaction of the conductive metal housing and the ionic particles in the coolant. The charged particles are not attracted to the dielectric material in the same manner as they are to the metallic surfaces and therefore the potential contaminating particles pass through the inlet-mixer without or with minimal deposition on the interior surfaces of the inlet-mixer. The coating, therefore, reduces or eliminates the need for costly cleaning and maintenance of the jet pump and maintains the flow path clear of these potential contaminants.

The dielectric coating electrochemically isolates the metal surface from the reactor water. The coating retards diffusion of oxygen to the metal surfaces. This results in reduced susceptibility to stress corrosion cracking of the metallic parts.

The coating is preferably a ceramic coating, e.g., a coating formed of $TiO_2$ or $Ta_2O_5$, although other coatings as described below may also be employed. The coating is applied by placing the nozzle assembly in a heated vacuum reactor vessel. Once the reaction conditions have been achieved, chemical precursors, e.g., $Ti(OC_2H_5)_4$ of a $Ta(OC_2H_5)_5$, are introduced into the system. These compounds thermally decompose on the surface of the parts, producing the dielectric coating and releasing several gases. The product is then cooled and installed in the nuclear reactor.

In a preferred embodiment according to the present invention, there is provided apparatus for minimizing or eliminating deposition of particulates in flow passages of a jet pump for a boiling water reactor comprising an inlet riser for receiving a flow of coolant, an inlet-mixer for receiving the coolant flow from the riser including a nozzle and a mixing section for receiving coolant flow from the nozzle and a flow of coolant induced from an annular space between a reactor vessel and a core shroud and a coating along interior wall surfaces of at least a portion of the inlet-mixer for eliminating or minimizing deposition of particulates from the coolant flow along the interior wall portions.

In a further preferred embodiment according to the present invention, there is provided a method for minimizing or eliminating deposition of particulates on interior wall surfaces defining a coolant flow passage in a jet pump for a nuclear reactor, comprising the steps of depositing a ceramic oxide material on the interior wall surfaces of one of a nozzle and a mixing section forming part of an inlet-mixer of the jet pump.

DETAILED DESCRIPTION OF THE INVENTION

Figure 1:
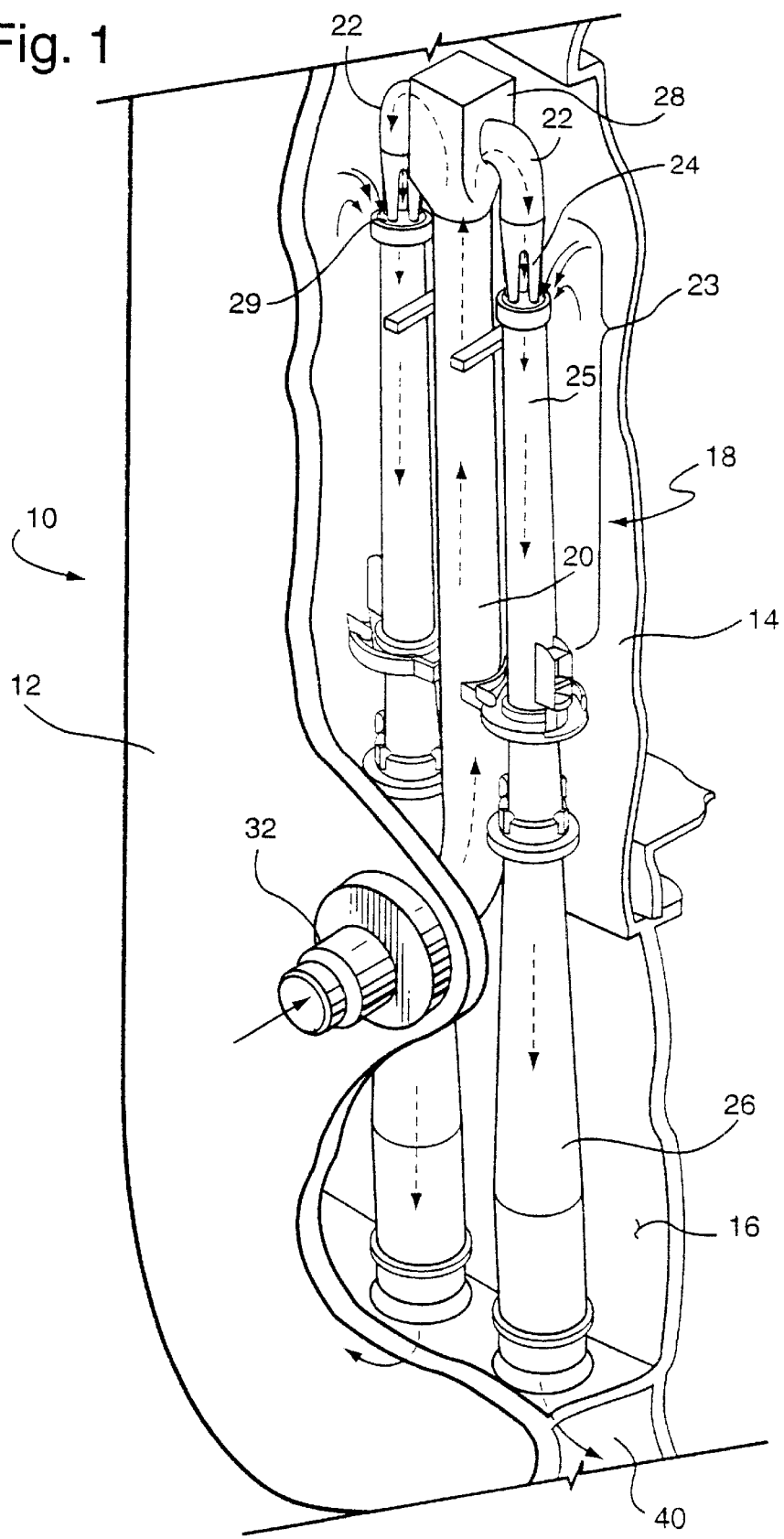
FIG. 1 is a fragmentary perspective view with portions broken out of a jet pump in an annular space between the inner shroud and the pressure vessel wall of a nuclear reactor.

Referring now to the drawings, particularly to FIG. 1, there is illustrated a reactor pressure vessel, generally designated 10, having a reactor pressure vessel wall 12 and an inner core shroud 14 defining a generally annular space 16 therebetween. The annular space 16 contains coolant. As in a typical boiling water nuclear reactor, a plurality of jet pumps, one being generally designated 18, are disposed at circumferential spaced positions about the pressure vessel between the pressure vessel wall 12 and the core shroud 14 and in the annular space 16. Each jet pump 18 typically comprises an inlet riser 20, a transition piece 28 adjacent the upper end of the inlet riser 20, a pair of elbows 22, inlet-mixers 23, each including nozzles 24 and mixing sections 25, and diffusers 26. Holddown assemblies adjacent the top of the jet pump 18, together with a number of braces and restraints maintain each jet pump 18 in fixed position in the annular space 16 between the core shroud 14 and pressure vessel wall 12. A thermal sleeve 32 penetrates the pressure vessel wall 12 and is welded at its juncture with an inlet elbow. The opposite end of the inlet elbow is secured to the lower end of the inlet riser 20. It will be appreciated that the foregoing-described jet pump 18 is conventional in construction. Thus, coolant enters the thermal sleeve 32 and flows through the elbow, upwardly in the inlet riser 20, through the inlet elbows 22 through nozzles 24 for flow in a downward direction through the mixing sections 25, the diffusers 26 and into a plenum 40 for upward flow through the reactor core. As conventional, the jet pump nozzles 24 induce a suction flow of coolant from the annular space 16 into the mixing section 25 which mixes with the coolant flow through the jet pump nozzles 23.

Figure 2:
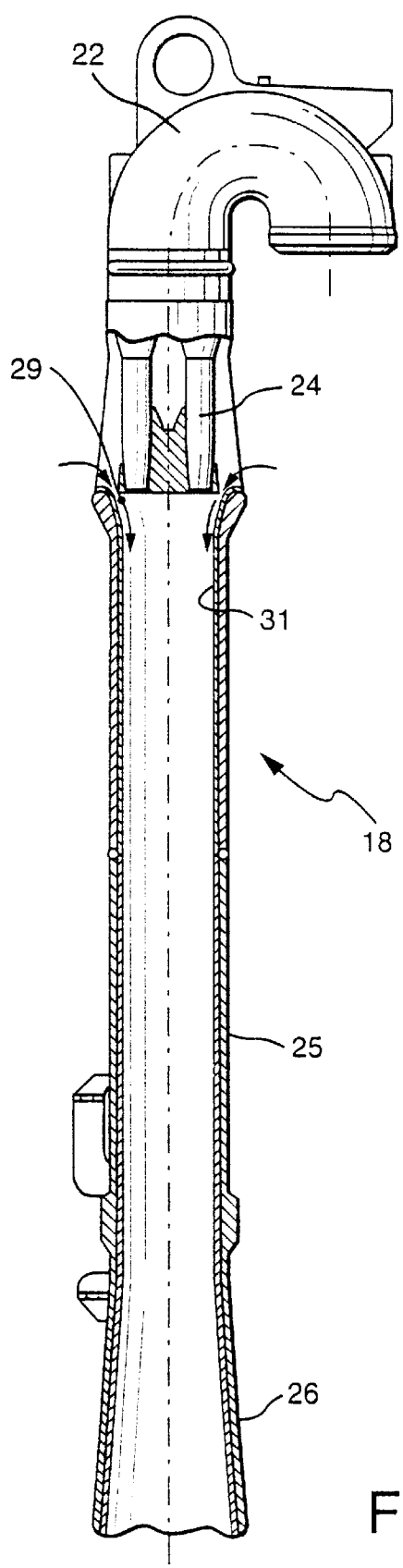
FIG. 2 is an enlarged elevational view of a transition piece adjacent the top of the pump, an inlet-mixer, and a diffuser with parts in cross-section for ease of illustration.

Referring more particularly to FIG. 2, there is illustrated a portion of a jet pump 18 having an inlet elbow 22 adjacent five nozzles 24. The nozzles 24 are supported above the mixing sections 25 and define therewith a generally annular suction flow passage 29 between the nozzles 24 and an inlet to the mixing section 25. It will be appreciated that the mixing section 25 is a cylindrical pipe which terminates at its lower end in an inlet to the diffuser 26. Consequently, the flow of coolant through the nozzles 24 induces a suction flow of coolant through the annular spacer 16 for flow into the mixing section 25. These combined nozzle and suction flows pass through the mixing section 25 and diffuser 26 and into plenum 40.

Figure 3:
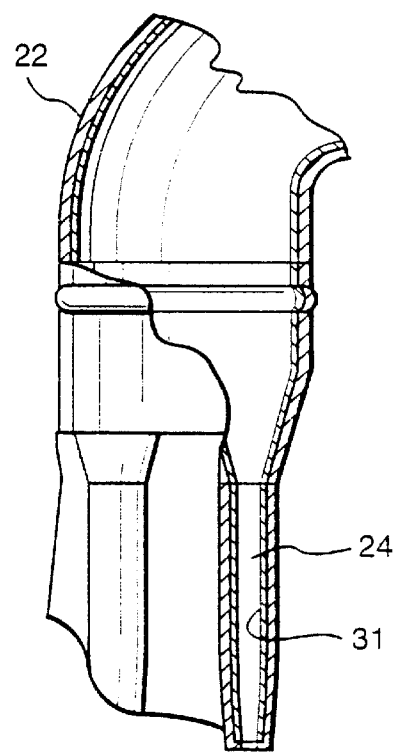
FIG. 3 is an enlarged fragmentary cross-sectional view of a nozzle discharge port of the inlet-mixer.

Referring now to FIG. 3, there is illustrated two of the nozzles 24. It will be appreciated that the interior passages through nozzles 24 are conical in shape with the diameter decreasing along the path of the fluid flow, thereby increasing the flow velocity into mixing section 25. The increased velocity induces additional fluid to flow into the sleeve through the annular opening 29 between the nozzles 23 and the mixer sleeve inlet as indicated by the arrows in FIG. 2.

In accordance with a preferred embodiment of the present invention, the inlet-mixer is provided with a coating that inhibits or eliminates "crud" build-up. To accomplish this, the inlet-mixer 23 is placed in a chemical vapor deposition ("CVD") reactor. The reactor is a heated vacuum vessel that is sufficiently large to house these parts. The vessel is then evacuated and the pressure is dropped to approximately 20 mtorr. Heat is applied to raise the temperature of the vessel and the part to a reaction temperature within a range of about 400°–500° C. and preferably about 450° C. When the vessel reaches the reaction temperature and pressure, chemical precursors, such as $Ti(OC_2H_5)_4$ or $Ta(OC_2H_5)_5$, are vaporized in the reactor chamber as a gas. These precursors impinge on the surface of the heated inlet-mixer part and thermally decompose to form a ceramic oxide coating, comprising, e.g., $TiO_2$ or $Ta_2O_5$, and byproduct gases. The coating continues to form and to grow until the gas flow is terminated and the temperature decreased. When a sufficiently thick coating is achieved, e.g., within a range of about 0.5–3 microns and preferably about 1.0 micron, heating is terminated and the vessel cools. The vacuum is then released and the coated jet pump part removed. The coating is indicated 31 in FIGS. 2 and 3 along the interior wall surfaces of the inlet-mixer 23.

The coating may comprise any dielectric coating, e.g., tantala (tantalum oxide, $Ta_2O_5$), titania (titanium oxide $TiO_2$), and zirconia ($ZrO_2$). However, in the preferred form, the dielectric coating is comprised of a ceramic oxide, preferably $TiO_2$ or $Ta_2O_5$. Thus, the application of this ceramic oxide coating reduces the electrical potential between the metal of the inlet-mixers and the charged particles in the water, minimizing or eliminating the build-up of "crud" on the surfaces of the inlet-mixers. That is, the rate of ion movement toward the inlet-mixer surface is significantly reduced or eliminated. Further, as a result of the above, the coating also serves to retard or eliminate stress corrosion cracking.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for minimizing or eliminating deposition of charged particulates on interior metal wall surfaces defining a coolant flow passage in a jet pump for a nuclear reactor, comprising the steps of:

depositing one of a titanium oxide, tantalum oxide and zirconium oxide dielectric material on the interior metal wall surfaces of one of a nozzle and a mixing section forming part of an inlet-mixer of the jet pump for disposition in the radioactive environment of the nuclear reactor to reduce or eliminate any electric potential between the metal wall surfaces and the charged particulates.

2. A method according to claim 1 wherein said material is applied by chemical vapor deposition.

3. A method according to claim 1 wherein the step of depositing includes heating said one of said nozzle and said mixing section in a vacuum chamber.

4. A method according to claim 3 wherein the vacuum chamber is heated to about 400° C.–500° C.

5. A method according to claim 1 wherein the step of depositing includes flowing a precursor material through said reactor and allowing a coating to form on said one of said nozzle and said mixing section.

6. A method according to claim 1 including depositing the material to a thickness of about 0.5–3 microns.

7. A method according to claim 1 wherein the step of depositing includes coating said one nozzle and said mixing section with $Ta_2O_5$.

8. A method according to claim 1 wherein the step of depositing includes coating said one nozzle and said mixing section with $TiO_2$.

9. A method according to claim 1 wherein the step of depositing includes coating said one nozzle and said mixing section with $ZrO_2$.

10. A method for protecting interior metal wall surfaces defining a coolant flow passage in a jet pump, comprising the steps of:

minimizing or eliminating deposition of charged particulates in the coolant flowing through the jet pump on the metal wall surfaces by depositing a ceramic oxide dielectric material selected from the group consisting of titanium oxide, tantalum oxide, and zirconium oxide on the interior metal wall surfaces of one of a nozzle and a mixing section forming part of an inlet mixer of the jet pump and thereby to reduce or eliminate any electric potential between the metal wall surfaces and the charged particulates.

11. A method of protecting interior metal wall surfaces defining a coolant flow passage in a jet pump, comprising the steps of:

(a) depositing a ceramic oxide dielectric material selected from the group consisting of titanium oxide, tantalum oxide and zirconium oxide on the interior metal wall surfaces of one a nozzle and a mixing section forming part of an inlet mixer of the jet pump;

(b) flowing a fluid coolant having charged particulates therein through the jet pump; and (c) wherein step (a) reduces or eliminates any electric potential between the metal wall surfaces and the charged particulates of the fluid coolant flowing through the jet pump to minimize or eliminate deposition of the charged particulates on the interior metal wall surfaces.

* * * * *